United States Patent
Kashiwabara et al.

(10) Patent No.: US 9,722,202 B2
(45) Date of Patent: Aug. 1, 2017

(54) DISPLAY APPARATUS HAVING AUXILIARY LINE AND METHOD FOR MANUFACTURING THE SAME

(71) Applicant: SAMSUNG DISPLAY CO., LTD., Yongin, Gyeonggi-Do (KR)

(72) Inventors: Mitsuhiro Kashiwabara, Yokohama (JP); Toshiyuki Matsuura, Yokohama (JP)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/690,722

(22) Filed: Apr. 20, 2015

(65) Prior Publication Data
US 2015/0303245 A1 Oct. 22, 2015

(30) Foreign Application Priority Data
Apr. 22, 2014 (JP) ................. 2014-088110

(51) Int. Cl.
*H01L 51/52* (2006.01)
*H01L 51/56* (2006.01)
*H01L 27/32* (2006.01)

(52) U.S. Cl.
CPC .......... *H01L 51/5228* (2013.01); *H01L 27/32* (2013.01); *H01L 27/3258* (2013.01);
(Continued)

(58) Field of Classification Search
CPC . H01L 27/32; H01L 27/3276; H01L 51/5212; H01L 51/5228; H01L 51/56
See application file for complete search history.

(56) References Cited

U.S. PATENT DOCUMENTS

| | | | |
|---|---|---|---|
| 7,423,374 B2 | 9/2008 | Okano | |
| 8,004,180 B2 | 8/2011 | Seo | |

(Continued)

FOREIGN PATENT DOCUMENTS

| | | |
|---|---|---|
| EP | 2 178 124 A1 | 4/2010 |
| EP | 2 627 156 A1 | 8/2013 |

(Continued)

OTHER PUBLICATIONS

Definition of Corresponding. (n.d.) American Heritage® Dictionary of the English Language, Fifth Edition. (2011). Retrieved Aug. 9, 2016 from http://www.thefreedictionary.com/corresponding.*

*Primary Examiner* — Michael Jung
(74) *Attorney, Agent, or Firm* — Lee & Morse, P.C.

(57) ABSTRACT

Display apparatus, including a substrate; a pixel electrode on the substrate and corresponding to a pixel; an auxiliary line on the substrate and insulated from the pixel electrode; an insulation layer on the pixel electrode and the auxiliary line, the insulation layer covering at least a portion of the pixel electrode and at least a portion of the auxiliary line; an organic light emitting layer on the pixel electrode, the auxiliary line, and the insulation layer; a first electrode on the organic light emitting layer and overlapping at least a portion of the auxiliary line; an opening in each of the organic light emitting layer and the first electrode to correspond to the auxiliary line; and a second electrode on the first electrode and an exposed portion of the auxiliary line, the second electrode electrically connecting the auxiliary line to the first electrode, the exposed portion of the auxiliary line being exposed by the opening.

11 Claims, 10 Drawing Sheets

(52) U.S. Cl.
CPC ...... *H01L 27/3276* (2013.01); *H01L 51/5212* (2013.01); *H01L 51/56* (2013.01)

(56) References Cited

U.S. PATENT DOCUMENTS

| | | | | |
|---|---|---|---|---|
| 2007/0108899 A1* | 5/2007 | Jung | ................... | H01L 27/3276 313/506 |
| 2007/0194699 A1* | 8/2007 | Lee | ..................... | H01L 27/3276 313/505 |
| 2010/0102335 A1* | 4/2010 | Takagi | ................ | H01L 51/5228 257/88 |
| 2014/0145156 A1* | 5/2014 | Choi | ................... | H01L 51/5275 257/40 |
| 2014/0239262 A1* | 8/2014 | Kim | ................... | H01L 51/5212 257/40 |

FOREIGN PATENT DOCUMENTS

| | | | |
|---|---|---|---|
| JP | 2001-195008 | A | 7/2001 |
| JP | 2001-230086 | A | 8/2001 |
| JP | 2002-169483 | A | 6/2002 |
| JP | 2002-359075 | A | 12/2002 |
| JP | 2005-011810 | A | 1/2005 |
| JP | 2005-093398 | A | 4/2005 |
| JP | 2007-258189 | A | 10/2007 |
| JP | 2015-121764 | A | 7/2015 |

\* cited by examiner

DISPLAY APPARATUS HAVING AUXILIARY LINE AND METHOD FOR MANUFACTURING THE SAME

CROSS-REFERENCE TO RELATED APPLICATION

Japanese Patent Application No. 2014-088110, filed on Apr. 22, 2014, in the Japanese Patent Office, and entitled: "Display Apparatus and Method for Manufacturing the Same," is incorporated by reference herein in its entirety.

BACKGROUND

1. Field

Embodiments relate to a display apparatus and a method for manufacturing the same.

2. Description of the Related Art

Display apparatuses may use light emitting devices such as organic electroluminescence diodes (organic EL devices). For example, in an active-matrix driving type organic EL display apparatus, an organic EL device may emit light by using a thin film transistor (TFT) disposed on each of pixels to display an image.

SUMMARY

Embodiments may be realized by providing a display apparatus, including a substrate; a pixel electrode on the substrate and corresponding to a pixel; an auxiliary line on the substrate and insulated from the pixel electrode; an insulation layer on the pixel electrode and the auxiliary line, the insulation layer covering at least a portion of the pixel electrode and at least a portion of the auxiliary line; an organic light emitting layer on the pixel electrode, the auxiliary line, and the insulation layer; a first electrode on the organic light emitting layer and overlapping at least a portion of the auxiliary line; an opening in each of the organic light emitting layer and the first electrode to correspond to the auxiliary line; and a second electrode on the first electrode and an exposed portion of the auxiliary line, the second electrode electrically connecting the auxiliary line to the first electrode, the exposed portion of the auxiliary line being exposed by the opening.

The exposed portion of the auxiliary line may include at least one stepped portion.

The stepped portion may have an edge adjacent to the organic light emitting layer, and the edge of the stepped portion may have a reversely tapered shape that protrudes.

The stepped portion may have a height greater than about ¼ of a thickness of the organic light emitting layer.

The second electrode may include a plurality of second electrodes, each second electrode being on each of at least one or more pixels, and a mean value of electric resistance of the auxiliary line and the first electrode which are electrically connected to each other by the second electrodes may be below about 200 kΩ.

The first electrode may have one side that overlaps the auxiliary line and another side that extends from the one side to overlap the pixel electrode, and the second electrode may not overlap the pixel electrode.

The display apparatus may further include a power supply line electrically connected to the auxiliary line through at least one of the first and second electrodes to supply power allowing the organic light emitting layer to emit light.

The pixel electrode and the auxiliary line may be on a same layer.

Embodiments may be realized by providing a method for manufacturing a display apparatus, the method including providing a substrate; forming a pixel electrode corresponding to a pixel on the substrate; forming an auxiliary line on the substrate, the auxiliary line being insulated from the pixel electrode; forming an insulation layer on the pixel electrode and the auxiliary line to cover at least a portion of the pixel electrode and at least a portion of the auxiliary line; forming an organic light emitting layer on the pixel electrode, the auxiliary line, and the insulation layer; forming a first electrode on the organic light emitting layer to overlap at least a portion of the auxiliary line; applying a voltage between the auxiliary line and the first electrode to generate discharge; removing portions of the organic light emitting layer and the first electrode using the discharge; removing portions of the organic light emitting layer and the first electrode to form an opening that exposes an exposed portion of the auxiliary line; and forming a second electrode that electrically connects the first electrode and the exposed portion.

The voltage may be an alternating current (AC) voltage.

The voltage may be greater than that of a voltage at which insulation breakdown occurs in the organic light emitting layer.

The voltage may have an effective apply voltage of about 10 Vrms to about 30 Vrms.

The method may include forming a plurality of auxiliary lines insulated from each other. Forming the opening may be performed on each of the auxiliary lines.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
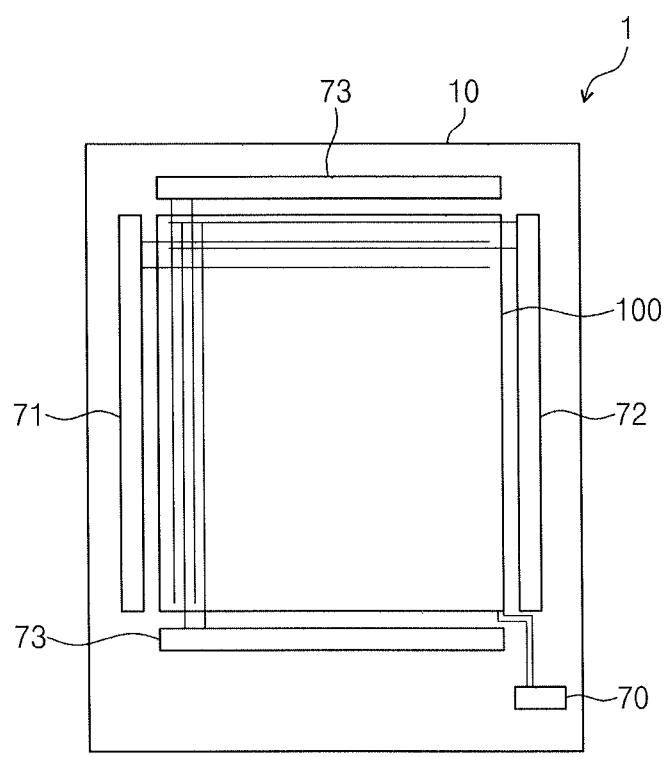
FIG. 1 illustrates a schematic view of a display apparatus according to a first embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Like reference numerals refer to like elements throughout. In the drawings, the dimensions and size of each structure may be exaggerated, omitted, or schematically illustrated for convenience in description and clarity. It will be understood that although the terms of first and second are used herein to describe various elements, these elements should not be limited by these terms. Terms are only used to distinguish one component from other components. For example, a first element referred to as a first element in one embodiment can be referred to as a second element in another embodiment. The terms of a singular form may include plural forms unless referred to the contrary.

The meaning of "include" or "comprise" specifies a property, a region, a fixed number, a step, a process, an element and/or a component but does not exclude other properties, regions, fixed numbers, steps, processes, elements and/or components. In the specification, it will be understood that when a layer (or film), a region, or a plate is referred to as being "on" another layer, region, or plate, it can be directly on the other layer, region, or plate, or intervening layers, regions, or plates may also be present. On the contrary to this, it will be understood that when a layer (or film), a region, or a plate is referred to as being "under" another layer, region, or plate, it can be directly under the other layer (or film), region, or plate, or intervening layers, regions, or plates may also be present.

Exemplary embodiments will be described below in more detail with reference to the accompanying drawings.

<1. First Embodiment>

Hereinafter, a display apparatus according to a first embodiment will be described with reference to FIGS. 1 to 15.

[1.1. Schematic Description of Display Apparatus]

FIG. 1 illustrate a schematic view of a display apparatus according to a first embodiment.

First, a schematic constitution of the display apparatus according to the first embodiment will be described with reference to FIG. 1.

As illustrated in FIG. 1, a display apparatus 1 may include a display area 100 defined on a substrate 10, driving circuits 71, 72, 73, and 74 disposed around the display area 100, and a voltage apply unit 70.

For example, the display apparatus 1 may include a top emission-type active-matrix driving-type organic EL. For example, the display apparatus 1 may be used as electronic equipment for displaying an image, such as smart phones, mobile phones, personal computers, and televisions.

The substrate 10 may be a substrate on which various devices for driving the display apparatus 1 are formed. For example, the substrate 10 may be a glass substrate, a semiconductor substrate such as a Si substrate, and a plastic substrate.

The display apparatus 1 may include a plurality of pixels provided on the display area 100. The display apparatus 1 may include an organic EL device corresponding to each of the pixel, a TFT for controlling light emission of the organic EL device, and a control line for controlling the TFT. An auxiliary line connected to an upper electrode of an organic EL device may be disposed on the display area 100. Non-uniformity in brightness within the display area 100, for example, due to voltage drop, may be improved by the auxiliary line. The auxiliary line will be described below.

The driving circuits 71, 72, 73, and 74 may be drivers for controlling a pixel circuit such as the TFT provided on each of the pixels of the display area 100 through a control line. A power source for supplying power allowing the organic EL device to emit light and a power connection line connecting the power source to the upper electrode through the auxiliary line may be disposed outside the display area 100 on which the driving circuits 71, 72, 73, and 74 are disposed.

A power source for applying an alternating current (AC) voltage between the auxiliary line and the upper electrode may be connected to the voltage apply unit 70. In an embodiment, a voltage applied by the voltage apply unit 70 may be, for example, the AC voltage. In an embodiment, the voltage applied by the voltage apply unit 70 may be a direct current (DC) voltage. Although described below, in the display apparatus 1 according to the first embodiment, a voltage may be applied between the auxiliary line and the upper electrode by the voltage apply unit 70, and discharge may occur by insulation breakdown. Thus, a contact opening for electrically connecting the auxiliary line to the upper electrode may be simply formed.

In the display apparatus 1 according to the first embodiment, the upper electrode (an electrode in the light emitting direction) of the organic EL device may be formed of, for example, a thin film metal having light transmission or transparent conductive oxide. The thin film metal or transparent conductive oxide may have a larger surface resistance by several $\Omega/\square$ or more as compared to other metals, a voltage drop may occur in the upper electrode, and non-uniformity in brightness in the display apparatus 1 may occur. For example, power may be supplied through an edge of the display area 100, and brightness at a central portion of the display area 100 of the display apparatus 1 may be less than that at the edge of the display area 100.

The display apparatus 1 according to the first embodiment may include an auxiliary line formed of a metal having low resistance on the substrate 10. The power supplied from the power source through the auxiliary line may be supplied to the upper electrode. The display apparatus 1 according to the first embodiment may prevent a voltage drop from occurring in the upper electrode. The display apparatus 1 according to the first embodiment may prevent a voltage drop from occurring in the upper electrode. Since the auxiliary line and the upper electrode are simply connected to each other, the manufacturing costs of the display apparatus 1 may be reduced, and the yield in production may be improved.

[1.2. Line Layout on Display Area]

Figure 2:
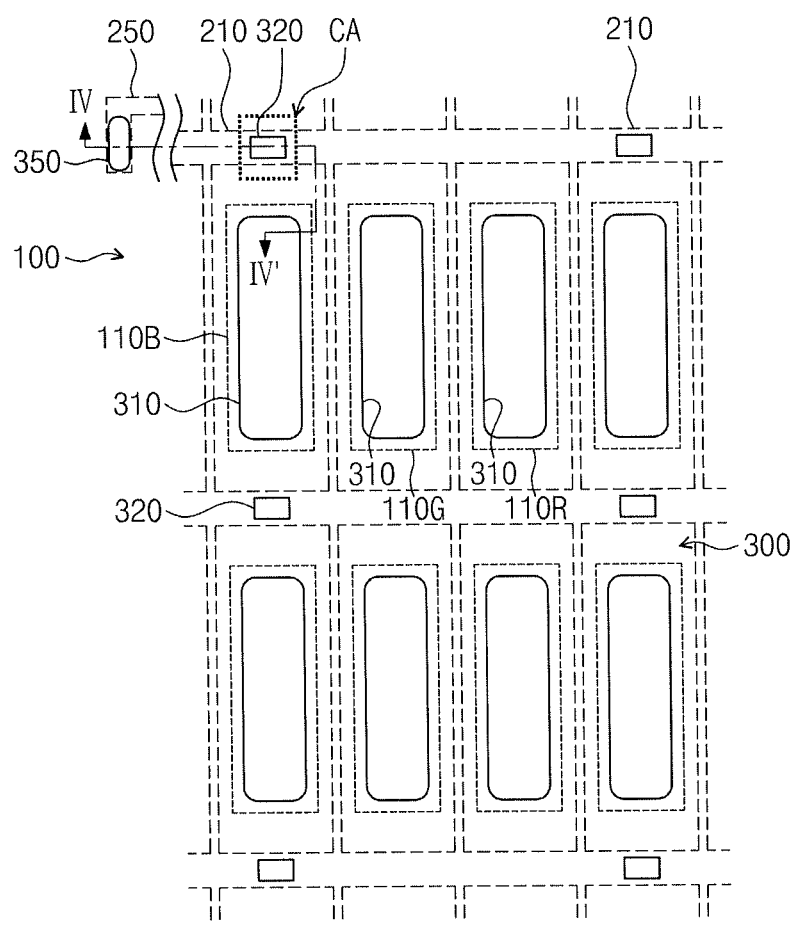
FIG. 2 illustrates a plan view of a layout of an auxiliary line on a display area of FIG. 1.

FIG. 2 illustrates a plan view of a layout of an auxiliary line on a display area of FIG. 1.

A line layout of the display apparatus 1 according to the first embodiment will be described with reference to FIGS. 2 and 3. A portion of the line of FIG. 2 may be omitted for simplified description. In FIG. 2, only eight pixels are illustrated as an example, and other pixels are omitted.

Referring to FIG. 2, pixel electrodes 110B, 110G, and 110R (hereinafter, referred to as pixel electrodes 110 if the pixel electrodes are not distinguished from each other) and an auxiliary line 210 may be disposed on the display area 100, and a power connection electrode 250 may be disposed outside the display area 100. An insulation layer 300 having a first opening 310, a second opening 320, and a third opening 350 may be disposed on the pixel electrode 110, the auxiliary line 210, and the power connection electrode 250.

An organic light emitting layer and an upper electrode may be successively disposed on the insulation layer 300, and an organic EL device may be formed by the pixel electrodes 110, the organic light emitting layer, and the upper electrode. Hereinafter, details thereof will be described with reference to FIG. 3.

Each of the pixel electrodes 110B, 110G, and 110R may be a lower electrode facing the upper electrode of the organic EL device corresponding to each of the pixels. Each of the pixel electrodes 110 may be connected to a pixel circuit formed by using a TFT. For example, the pixel electrode 110B may be a lower electrode of the organic EL device, which may emit blue light. The pixel electrode 110G may be a lower electrode of the organic EL device, which may emit green light. The pixel electrode 100R may be a lower electrode of the organic EL device, which may emit red light.

The auxiliary line 210 may be disposed between the pixel electrodes 110 adjacent to each other to supply the power to the upper electrode of the organic EL device corresponding to each pixel. The auxiliary line 210 may be disposed between at least pixel electrodes 110.

The pixel electrode 110 and the auxiliary line 210 may be formed as conductive layers disposed on the same plane. Each of the pixel electrode and the auxiliary line 210 may be formed of a metal having low resistance, for example, a silver alloy (AgPdCu). The pixel electrode 110 and the auxiliary line 210 may be formed of metals different from each other. The upper electrode facing the pixel electrodes 110 may be formed of, for example, a metal thin film formed of a magnesium-silver (MgAg) alloy or transparent conductive oxide such as indium tin oxide (ITO).

The power connection electrode 250 may be disposed outside the display area 100 to connect the power source for supplying power allowing the organic EL device to emit light to the upper electrode. Tt least one power connection electrode 250 may be provided on the whole display area 100.

The insulation layer 300 may have a plurality of openings and may cover the pixel electrode 110, the auxiliary line 210, and the power connection electrode 250. For example, the insulation layer 300 may be formed of an organic resin such as polyimide. The insulation layer 300 may have a first opening 310 defined in a position corresponding to each of the pixel electrodes 110, a second opening 320 defined in a position corresponding to a portion of the auxiliary line 210, and a third opening 350 defined in a position corresponding to a portion of the power connection electrode 250. The first opening 310 may be provided for connecting each of the pixel electrodes 110 to the organic light layer, and the second opening 320 may be disposed between the auxiliary line 210 and the pixel electrodes 110 disposed adjacent to each other to connect the auxiliary line 210 to the upper electrode of the organic EL device. The third opening 350 may be defined above the power connection electrode 250 to connect the power connection electrode 250 to the upper electrode. In an embodiment, the second opening 320 may be defined in each of the three pixel electrodes 110B, 110G, and 110R, as illustrated in FIG. 2. In an embodiment, the second opening 320 may be defined in each of the pixel electrodes 110, e.g., in each of 110B, 110G, and 110R.

Figure 3:
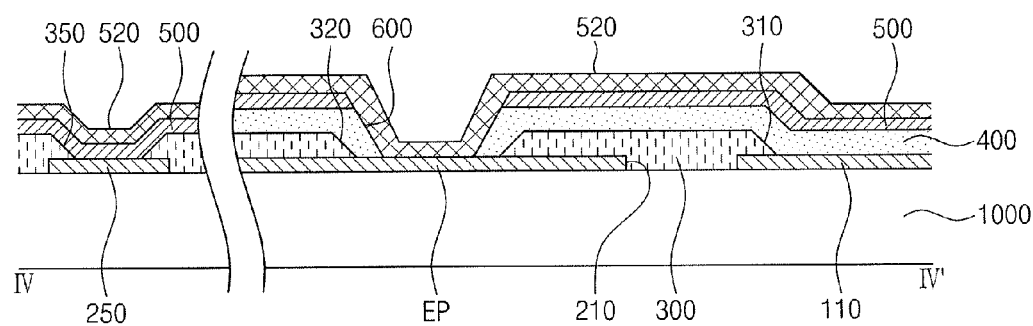
FIG. 3 illustrates a schematic cross-sectional view taken along line IV-IV' of FIG. 2.

FIG. 3 illustrates a schematic cross-sectional view taken along line IV-IV' of FIG. 2.

A stacked structure of the display apparatus 1 will be described with reference to FIG. 3. As illustrated in FIG. 3, the pixel electrode 110, the auxiliary line 210, and the power connection electrode 250 may be disposed on a substrate 1000. The insulation layer 300 having the first opening 310, the second opening 320, and the third opening 350 may be disposed on the auxiliary line 210 and the power connection electrode 250. An organic light emitting layer 400 and a first upper electrode 500 may be successively stacked on the insulation layer 300 of the display area 100. A contact opening 600 may be defined in the organic light emitting layer 400 and the first upper electrode 500. A portion of a top surface of the auxiliary line 210 may be exposed through the contact opening 600. Hereinafter, the portion of the auxiliary line 210 that is exposed through the contact opening 600 may be referred to as an exposure part EP.

A second upper electrode 520 may be disposed on the first upper electrode 500. The second upper electrode 520 may be connected to the auxiliary line 210 through the contact opening 600. The first and second upper electrodes 500 and 520 may be successively disposed on the insulation layer 300 outside the display area 100. The first and second upper electrodes 500 and 520 may be connected to the power connection electrode 250 through the third opening 350.

For example, the substrate 1000 may be a glass substrate including the pixel circuit constituted by the TFT. For convenience of description, the pixel circuit will be omitted. For example, a surface of the substrate 1000 may be polarized by the insulation layer formed of polyimide, which may cover the pixel circuit.

The pixel electrode 110 may be disposed on the substrate 1000 and connected to the pixel circuit of the substrate 1000 through a through-hole defined in the insulation layer. The auxiliary line 210 may be spaced apart from the pixel electrode 110 and disposed on the substrate 1000. The power connection electrode 250 may be disposed on the substrate 1000 outside the display area 100. The pixel electrode 110, the auxiliary line 210, and the power connection electrode 250 may be provided as, for example, the same conductive layer. For example, each of the pixel electrode 110, the auxiliary line 210, and the power connection electrode 250 may be provided as a conductive layer formed of a silver alloy having low resistance.

The insulation layer 300 may be disposed on the pixel electrode 110, the auxiliary line 210, and the power connection electrode 250. In the insulation layer 300, the first opening 310 may be defined in a position corresponding to a portion of the pixel electrode 110, the second opening 320 may be defined in a position corresponding to a portion of the auxiliary line 210, and the third opening 350 may be defined in a position corresponding to a portion of the power connection electrode 250. For example, the insulation layer 300 may be formed of an organic resin such as polyimide.

The organic light emitting layer 400 may be disposed on the insulation layer 300, the pixel electrode 110, and the auxiliary line 210. The organic light emitting layer 400 may include a contact opening 600 defined in a position corresponding to the second opening 320. The organic light emitting layer 400 may be a layer containing a light emitting material that is well-known and used for the organic EL device. For example, the organic light emitting layer 400 may include a hole injection layer, a hole transfer layer, a light emitting layer, an electron transfer layer, and an electron injection layer, which may be successively stacked from a side of the substrate 1000.

The first upper electrode 500 may be disposed on the organic light layer 400 and the power connection electrode 250. The first upper electrode 500 may include a contact opening 600 defined in a position corresponding to the second opening 320. The organic layer may be disposed between the first and second upper electrodes 500 and 520 and the pixel electrodes 110, and the organic LE device may be formed. For example, the first upper electrode 500 may be formed of a thin film metal having light transmission or transparent conductive oxide.

The second upper electrode 520 may be successively disposed on the auxiliary line 210 and the power connection electrode 250 which correspond to the first upper electrode 500 and the contact opening 600 to electrically connect the first upper electrode 500 to the auxiliary line 210. For example, the second upper electrode 520 may be formed of a thin film metal having light transmission or transparent conductive oxide. The second upper electrode 520 may be disposed on the first upper electrode 500 on an area corresponding to the pixel electrode 110.

In an example of FIG. 3, the first and second upper electrodes 500 and 520 may be disposed on the power connection electrode 250. In an embodiment, one of the first and second upper electrodes 500 and 520 may be disposed on the power connection electrode 250.

According to the above-described stacked structure, the first upper electrode 500 constituting the organic EL device may be connected to the power connection electrode 250 through the second upper electrode 520 and receive power allowing the organic light emitting layer 400 to emit light from the power connection electrode 250.

The auxiliary line 210 may be connected to the power connection electrode 250 through the second upper electrode 520. The auxiliary line 210 may have less resistance than the first upper electrode 500, and resistance power may be supplied to the first upper electrode 500 of the organic EL device corresponding to the pixel disposed at a central portion of the display area 100 that may be spaced apart from the power connection electrode 250 without causing a voltage drop. The display apparatus 1 according to the first embodiment may prevent the voltage drop, that may occur when the first upper electrode 500 is provided as a transparent electrode having high resistance, from occurring, may supply a power having the same intensity to each of the organic EL devices, and occurrence of non-uniformity in brightness within the display area 100 may be prevented.

In the above-described example, although the auxiliary line 210 is indirectly connected to the power connection electrode 250 through the first and second upper electrodes 500 and 520, the auxiliary line 210 may be directly connected to the power connection electrode 250.

[1.3. Method for Manufacturing Display Apparatus]

FIGS. 4 to 8 illustrate cross-sectional views of a process for manufacturing the display apparatus of FIG. 3.

A method for manufacturing the display apparatus 1 according to the first embodiment will be described with reference to FIGS. 4 to 8.

Figure 4:
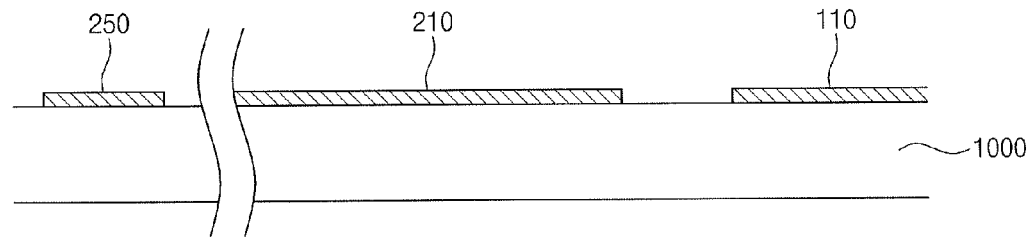
FIG. 4 illustrates a cross-sectional view of a process for manufacturing a display apparatus of FIG. 3.

As illustrated in FIG. 4, a conductive layer having low resistance may be formed on a substrate 1000. Then, a patterning process using photolithography may be performed to form a pixel electrode 110, an auxiliary line 210, and a power connection electrode 250.

Figure 5:
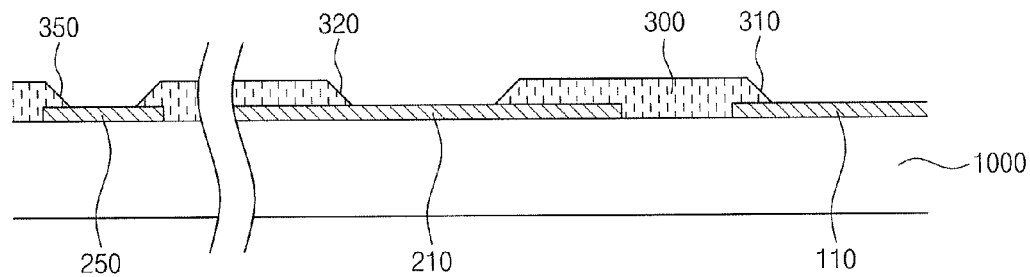
FIG. 5 illustrates a cross-sectional view of a process for manufacturing a display apparatus of FIG. 3.

Then, as illustrated in FIG. 5, an insulation layer 300 may be formed on the pixel electrode 110, the auxiliary line 210, and the power connection electrode 250, and then a first opening 310, a second opening 320, and a third opening 350 may be formed by performing a patterning process using photolithography. When the insulation layer 300 is formed of photosensitive polyimide, exposure and developing processes may be performed to form a pattern on the insulation layer 300.

Figure 6:
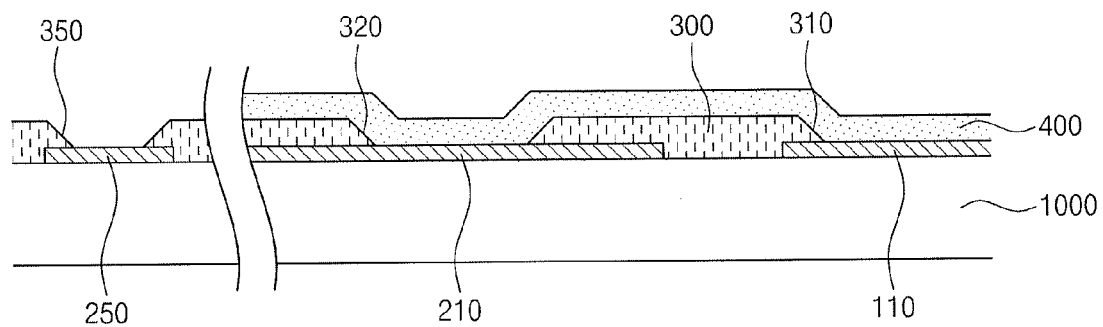
FIG. 6 illustrates a cross-sectional view of a process for manufacturing a display apparatus of FIG. 3.

Then, as illustrated in FIG. 6, an organic light emitting layer 400 may be formed on the insulation layer 300, the pixel electrode 110, and the auxiliary line 210 within the display area 100. For example, after oxygen plasma processing is performed, an organic light emitting layer 400 may be formed on the display area 100 by using a mask. The organic light emitting layer 400 may have a structure in which a plurality of organic layers are stacked. For example, a hole injection layer, a hole transfer layer, a light emitting layer, an electron transfer layer, and an electron injection layer may be successively stacked from a side of the substrate 1000. Materials known to those of skill in the art may be used as materials for forming the hole injection layer, the hole transfer layer, the light emitting layer, the electron transfer layer, and the electron injection layer.

The organic light emitting layer 400 on the at least pixel electrode 110 may include the light emitting layer, and the organic light emitting layer on an area except for the pixel electrode 110 may not include the light emitting layer. For example, a thickness and/or stacked structure of the organic may be different according to the formation area thereof.

Figure 7:
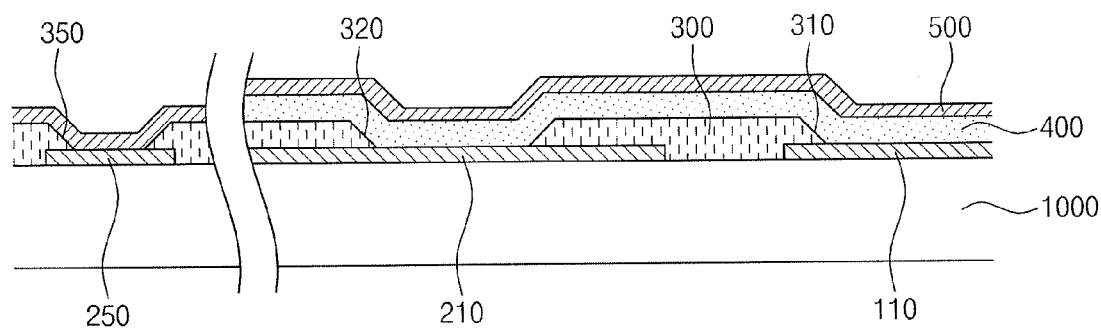
FIG. 7 illustrates a cross-sectional view of a process for manufacturing a display apparatus of FIG. 3.

Then, as illustrated in FIG. 7, a first upper electrode 500 having light transmission may be formed on the organic light emitting layer 400 and the power connection electrode 250. For example, the first upper electrode 500 may be formed of a metal thin film such as MgAg having light transmission or conductive oxide such as ITO.

Figure 8:
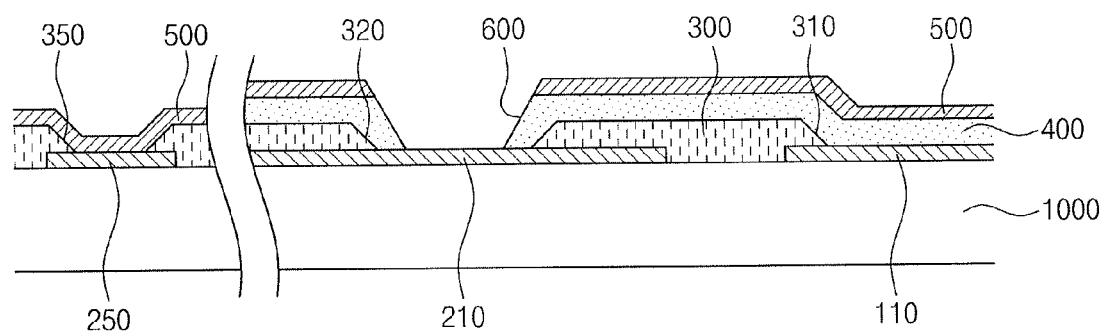
FIG. 8 illustrates a cross-sectional view of a process for manufacturing a display apparatus of FIG. 3.

Then, as illustrated in FIG. 8, the organic light emitting layer 400 and the first upper electrode 500 may be removed to correspond the second opening 320 to form a contact opening 600.

For example, the voltage apply unit 70 of FIG. 1 may apply a voltage between the auxiliary line 210 and the first upper electrode 500, and discharge may occur, for example, due to insulation breakdown. The organic light emitting layer 400 and the first upper electrode 500 may be removed by the discharge, for example, due to the insulation breakdown, to form the contact opening 600. A level of the voltage applied between the auxiliary line 210 and the first upper electrode 500 by the voltage apply unit 70 may be greater than that of the voltage at which the insulation breakdown may occur in the organic light emitting layer 400. For example, the voltage may be an AC voltage and may have a frequency of about 100 kHz. An effective apply voltage may be about 10 Vrms to about 30 Vrms.

To perform the above-described processes, the first upper electrode 500 may be, for example, about 5 nm to about 20 nm thick. If the first upper electrode 500 has a thickness less than that of about 5 nm, conductivity may be deteriorated, surface resistance may increase, and it may be difficult to cause the discharge, for example, due to the insulation breakdown. If the first upper electrode 500 has a thickness greater than that of about 20 nm, it may be difficult to remove the organic light emitting layer 400 and the first upper electrode 500 through the discharge, for example, due to the insulation breakdown, and a short-circuit may occur.

In all of the second openings 320 within the display area 100, a voltage may be applied between the auxiliary line 210 and the first upper electrode 500 to cause the discharge, for example, due to the insulation breakdown, and form the contact opening 600 at once. As described below in a second embodiment, current flowing between the auxiliary line 210 and the first upper electrode 500 may be prevented from excessively increasing in intensity.

As illustrated in FIG. 3, an upper electrode 520 may be formed on an exposure part EP of the auxiliary line 210 that may be exposed by the contact opening 600, the first upper electrode 500, and the power connection electrode 250 to manufacture the display apparatus 1 of FIG. 3. The second upper electrode 520 may electrically connect the auxiliary line 210 to the first upper electrode 500 through the contact opening 600 to supply power from the power connection electrode 250 to the auxiliary line 210. The second upper electrode 520 may be formed of a metal thin film such as MgAg having light transmission or conductive oxide such as ITO.

In the display apparatus 1, the display area 100 may be covered by using a transparent encapsulation glass to bond the substrate 1000 to the transparent encapsulation glass by using a VU curing resin, air and moisture may be prevented from being introduced, and the inside of the display apparatus 1 may be encapsulated.

In the process of forming the above-described contact opening 600, the first upper electrode 500 may be formed on the organic light emitting layer 400 to correspond to an area of the pixel electrode 110, and the first upper electrode 500 may protect the organic light emitting layer 400 and may prevent the organic EL device from being degraded.

For example, in the process of forming the contact opening 600, the first upper electrode 500 and the organic light emitting layer 400, which may be removed by insulation breakdown, for example, due to the discharge, may be scattered as contaminants. The first upper electrode 500 may be formed on the organic light emitting layer 400, and the first upper electrode 500 may protect the organic light emitting layer 400 against the contaminants. The first upper electrode 500 may protect the organic light emitting layer 400 against a change in external environment when the process of forming the contact opening 600 is performed.

A connection portion between the auxiliary line 210 and the second upper electrode 520 through the contact opening 600 may have relatively low resistance, and non-uniformity in brightness on the entire screen may be restricted, uniformity in brightness may be secured, and power consumption may be reduced. To maintain the uniformity in distribution of the brightness within the display area 100, for example, voltage drop at the connection portion may be restricted to a voltage of about 2 V or less, for example, about 0.5 V or less. Peak current in one pixel that may be required for emitting light from the organic light emitting layer 400 of the display apparatus having the high brightness may be about 100 µA. One connection portion may be formed on the one pixel of the display apparatus having the high brightness, and the connection portion may have electrical resistance of about 200 kΩ or less, for example, about 50 kΩ or less.

One connection portion may be formed on a plurality of pixels (N numbers), electrical resistance at the connection portion may be about $(1/N) \times 200$ kΩ or less, and the voltage drop at the connection portion may be restricted to a voltage of about 2 V or less. To restrict the voltage drop at the connection portion to a voltage of about 0.5 V or less, electrical resistance at the connection portion may be about $(1/N) \times 50$ kΩ or less.

A mean value of electrical resistance at all of connection portions between the auxiliary line 210 and the second upper electrode 520 within the display area may be less than the above-described value. The electrical resistance at each of all of the connection portions within the display area 100 may be less than the above-described value.

As described above, in the display apparatus 1 according to the first embodiment, a voltage may be applied between the first upper electrode 500 and the auxiliary line 210, the discharge, for example, due to insulation breakdown, may occur in the second opening 320, and the organic light emitting layer 400 and the first upper electrode 500 may be removed to form the contact opening 600. The exposure part EP of the auxiliary line 210 may be exposed by the contact opening 600 in the display apparatus 1 according to the first embodiment, and the second upper electrode 520 may be electrically connected to the first upper electrode 500 and the auxiliary line 210.

In the display apparatus 1 according to the first embodiment, the organic light emitting layer 400 and the first upper electrode 500 may be removed by the discharge, it may be unnecessary to perform alignment with a mask or selective laser irradiation, and the manufacturing process may be simplified. In the display apparatus 1 according to the first embodiment, the possibility of an occurrence of defects within the display area 100 may be reduced. A voltage drop occurring at the upper electrode may be restricted, and non-uniformity in brightness within the display area 100 may be prevented.

[1.4. Modified Example of Display Apparatus]

FIGS. 9 to 12 illustrate plan views (a) and cross-sectional views (b) of a modified example of the auxiliary line 210 of the display apparatus according to the first embodiment.

Hereinafter, the modified example of the display apparatus according to the first embodiment will be described with reference to FIGS. 9 to 12. In the modified example of the display apparatus according to the first embodiment, a stepped portion may be formed on a surface opposite to the substrate 1000 of the auxiliary line 210 to correspond to the second opening 320, and the discharge, for example, due to insulation breakdown, may more securely occur.

In the display apparatus of FIGS. 9 to 12, the auxiliary line 210 may be disposed on the substrate 1000. The insulation layer 300 having the second opening 320 may be disposed on the auxiliary line 210. For example, a method for manufacturing the display apparatus of FIGS. 9 to 12 may correspond to the method for manufacturing the display apparatus 1 of FIG. 5 after the insulation layer 300 is formed. FIGS. 9 to 12 illustrate enlarged views of a contact area CA of FIG. 2. The areas on which the pixel electrode 110 and the power connection electrode 250 will be omitted.

Figure 9A:
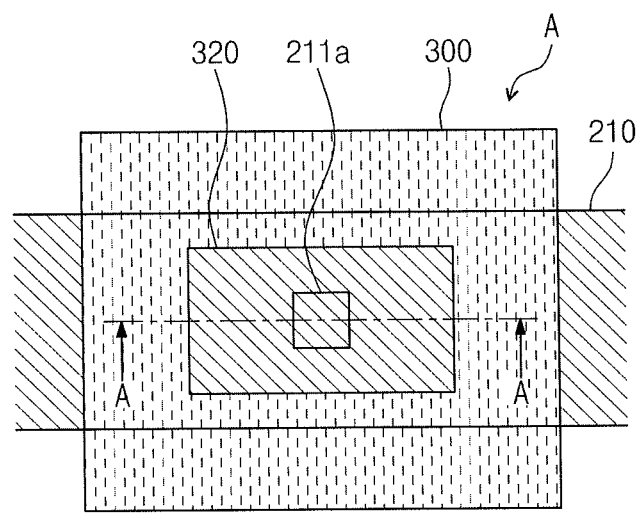
FIG. 9A illustrates a plan view of a modified example of the auxiliary line of the display apparatus according to the first embodiment.
Figure 9B:
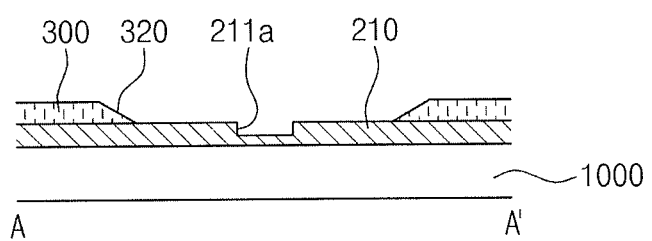
FIG. 9B illustrates a cross-sectional view of a modified example of the auxiliary line of the display apparatus according to the first embodiment.

As illustrated in FIG. 9, for example, the auxiliary line 210 according to the modified example may include a pattern area 211a (that is a concave (ㅂ) portion) having a groove that is recessed downward from a top surface of the auxiliary line 210. The pattern area 211a may have a layer thickness less than that of the other area, and a stepped portion may be formed along a boundary between the pattern area 211a and the other area.

In direct opposition to the example of FIG. 9, the auxiliary line 210 according to the modified example may include a protrusion that protrudes upward from the top surface of the auxiliary line 210. The protrusion may have a thickness greater than that of the area of the auxiliary line 210. A stepped portion may be formed along a boundary between the protrusion and the other area.

Figure 10A:
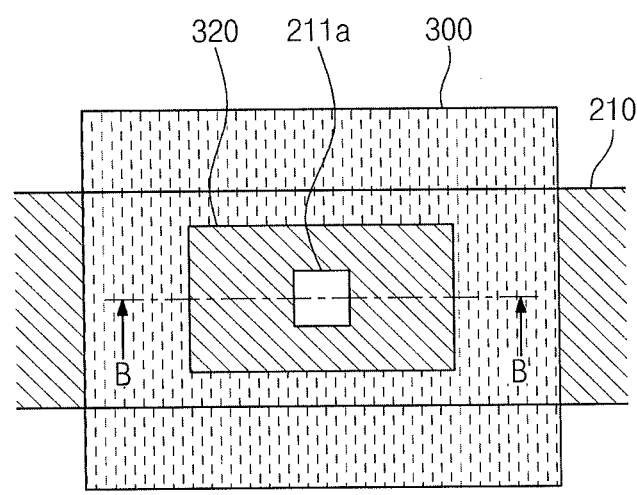
FIG. 10A illustrates a plan view of another modified example of the auxiliary line of the display apparatus according to the first embodiment.
Figure 10B:
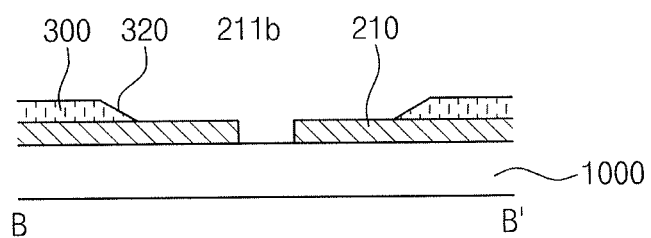
FIG. 10B illustrates a cross-sectional view of another modified example of the auxiliary line of the display apparatus according to the first embodiment.
Figure 11A:
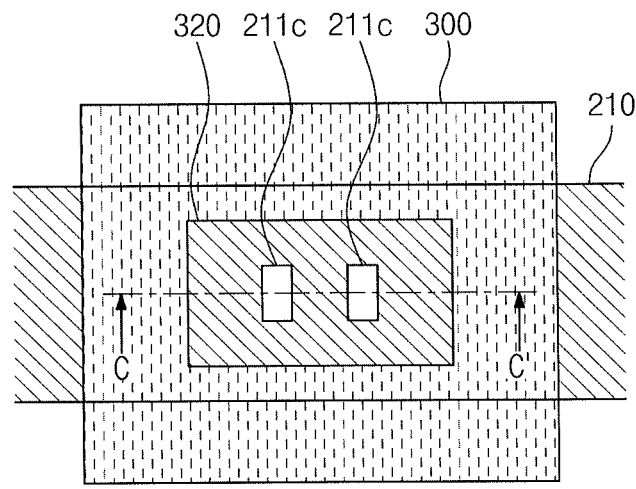
FIG. 11A illustrates a plan view of another modified example of the auxiliary line of the display apparatus according to the first embodiment.
Figure 11B:
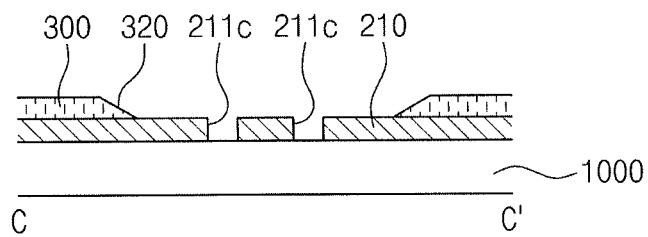
FIG. 11B illustrates a cross-sectional view of another modified example of the auxiliary line of the display apparatus according to the first embodiment.

As illustrated in FIG. 10, for example, the auxiliary line 210 according to the modified example may include a pattern area 211b that is opened to expose the top surface of the substrate 1000 and a stepped portion formed by the pattern area 211b. For example, the auxiliary line 210 may not be formed to correspond to a central portion of the opening 320, or a portion of the previously formed auxiliary line 210, which corresponds to a central portion of the second opening 320 may be removed to form the pattern area 211b. As illustrated in FIG. 11, for example, the auxiliary line 210 according to the modified example may have a plurality of pattern areas 211c. The pattern areas 211c may be formed by opening the auxiliary line 210, and the top surface of the substrate 1000 may be exposed through the pattern areas 211c. A stepped portion may be formed along a boundary between the pattern areas 211c and the other area.

Figure 12A:
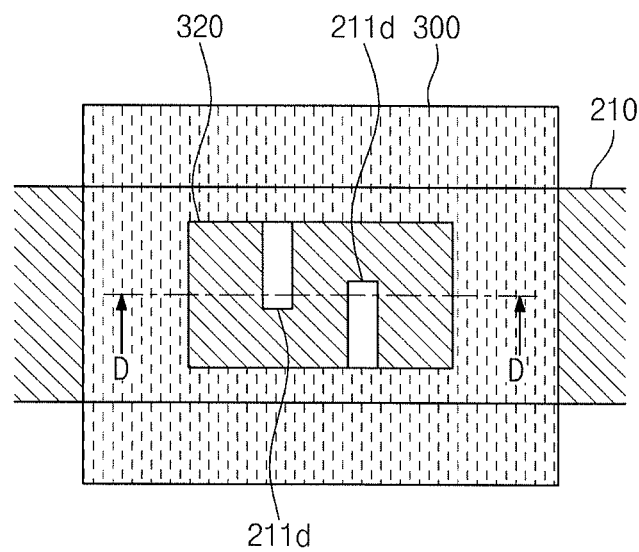
FIG. 12A illustrates a plan view of another modified example of the auxiliary line of the display apparatus according to the first embodiment.
Figure 12B:
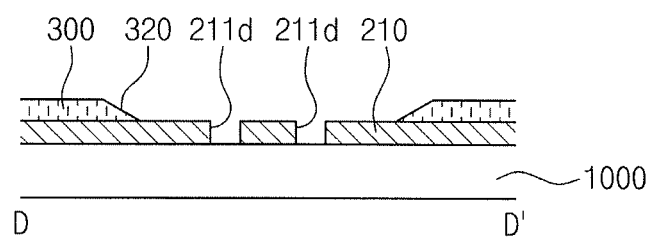
FIG. 12B illustrates a cross-sectional view of another modified example of the auxiliary line of the display apparatus according to the first embodiment.

As illustrated in FIG. 12, for example, a pattern area 211d may be further formed in the other area that does not correspond to the second opening 320 in addition to the area corresponding to the second opening 320. The pattern area 211d may be formed by opening the auxiliary line 210, and the top surface of the substrate 1000 may be exposed through the pattern area 211d.

The above-described pattern areas 211a, 211b, 211c, and 211d may be, for example, formed through the photolithograph process. The pattern areas 211a, 211b, 211c, and 211d may be formed when the auxiliary line 210 is formed or after the auxiliary line 210 is formed.

The number, positions, sizes of the above-described pattern areas 211a, 211b, 211c, and 211d may be randomly set if at least a portion of the pattern areas 211a, 211b, 211c, and 211d is provided on an area corresponding to the second opening 320, and the auxiliary line 210 is not electrically opened.

Figure 13:
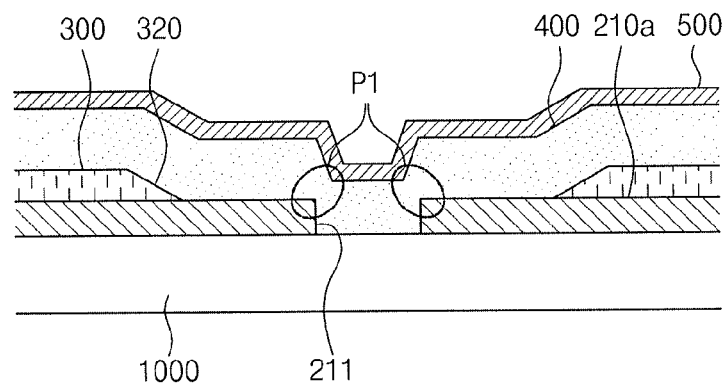
FIG. 13 illustrates a cross-sectional view of a modified example of the display apparatus when discharge due to insulation breakdown is performed according to the first embodiment.
Figure 14:
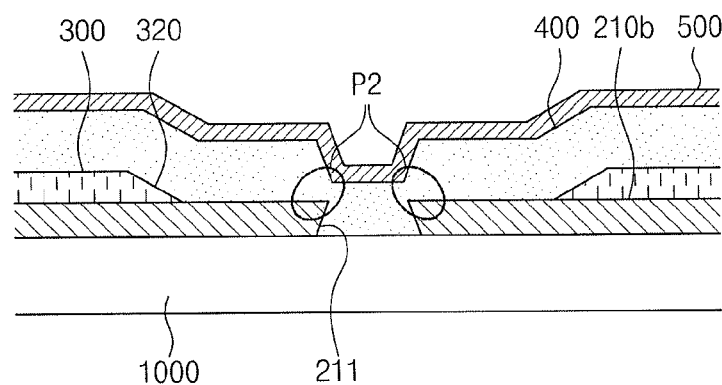
FIG. 14 illustrates a cross-sectional view of an exemplary modified example of the auxiliary line of the display apparatus according to the first embodiment.

FIG. 13 illustrates a cross-sectional view of a modified example of the display apparatus when the discharge, for example, due to insulation breakdown, is performed according to the first embodiment. FIG. 14 illustrates a cross-sectional view of an exemplary modified example of the auxiliary line of the display apparatus according to the first embodiment, and FIG. 15 illustrates a cross-sectional view of an undesirable modified example of the auxiliary line of the display apparatus according to the first embodiment.

A principle in which the discharge may more strongly occur by insulation breakdown when the stepped portion is formed on the auxiliary line 210 will be described with reference to FIGS. 13 to 15.

Figure 15:
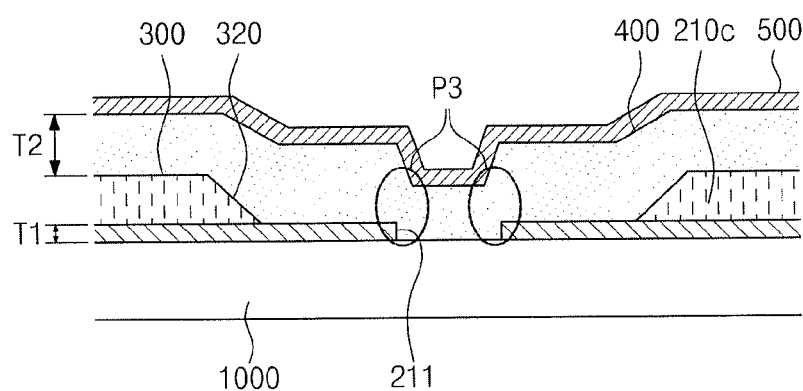
FIG. 15 illustrates a cross-sectional view of an undesirable modified example of the auxiliary line of the display apparatus according to the first embodiment.

The display apparatus of FIGS. 13 to 15 may include an auxiliary line 210 having a stepped portion on the substrate 1000. The insulation layer 300 having the second opening 320 may be disposed on the auxiliary line 210. The organic light emitting layer 400 may be disposed on the insulation layer 300, and the first upper electrode 500 may be disposed on the organic light emitting layer 400. A method for manufacturing the display apparatus of FIGS. 13 to 15 may correspond to the method for manufacturing the display apparatus 1 of FIG. 7 after the first upper electrode 500 is formed. In FIGS. 13 to 15, the areas on which the pixel electrode 110 and the power connection electrode 250 are formed will be omitted.

In the display apparatus of FIG. 13, the organic light emitting layer 400 disposed on the auxiliary line 210a may have a layer thickness less than that of the other area at the vicinity P1 of a stepped portion formed on an auxiliary line 210a by the pattern area 211, and electrical resistance at the vicinity P1 of the stepped portion may be less than that of the other area. Electric fields may be concentrated into the vicinity P1 of the stepped portion, and the discharge at the vicinity P1 of the stepped portion formed on the auxiliary line 210a may more easily occur at a relatively low voltage in comparison to the other area.

Since the modified example the display apparatus 1 according to the modified example of the first embodiment may include the auxiliary line 210a having the stepped portion, the discharge, for example, due to insulation breakdown, may easily occur, and the organic light emitting layer 400 and the first upper electrode 500 may be more securely removed to more precisely easily form the contact opening 600.

As illustrated in FIG. 14, the stepped portion formed on the auxiliary line 210b by the pattern area 211 may have a reversely tapered shape in which an edge of a side of the second opening 320 protrudes. For example, the edge of the side of the first upper electrode 500 may have an acute angle less than that of 90°. The pattern area 211 may include an upper opening adjacent to the first upper electrode 500 and a lower opening adjacent to the substrate 1000 and having an area less than that of the upper opening.

The organic light emitting layer 400 disposed on the auxiliary line 210b may have a layer thickness less than that of the other area at the vicinity P2 of the stepped portion formed on the auxiliary line 210b by the pattern area 211, and the electric fields may be concentrated into the vicinity P2 of the stepped portion, and the discharge, for example, due to insulation breakdown, may more easily occur.

In an embodiment, the stepped portion formed on the auxiliary line 210b may have a forwardly tapered shape, the edge of the side of the first upper electrode 500 may have an obtuse angle greater than that of 90°, the organic light emitting layer 400 on the vicinity of the stepped portion formed on the auxiliary line 210b may have a layer thickness different from that of the organic light emitting layer 400 on the other area, and it may be difficult to concentrate the electric fields into the vicinity of the stepped portion formed on the auxiliary line 210b and cause the discharge, for example, due to insulation breakdown.

The stepped portion formed on the auxiliary line 210c by the pattern area 211 may have a height T1 greater than about ¼ of a layer thickness T2 of the organic light emitting layer 400. For example, referring to FIG. 15, the stepped portion formed on the auxiliary line 210c may have a height T1 less than about ¼ of the layer thickness T2 of the organic light emitting layer 400, and a difference between the layer thickness of the organic light emitting layer 400 at a vicinity P3 of a stepped portion formed on the auxiliary line 210c and the layer thickness of the light emitting layer 400 at the other area may be less. Since it may be difficult to concentrate the electric fields into the vicinity of the stepped portion formed on the auxiliary line 210c and cause the discharge, for example, due to insulation breakdown, this may be undesirable.

Hereinbefore, the display apparatus 1 according to the first embodiment was described in detail.

<2. Second Embodiment>

Figure 16:
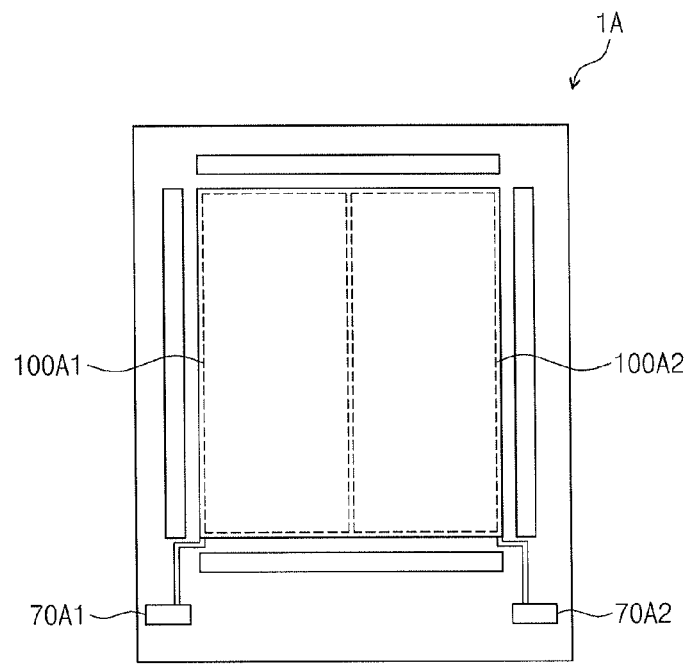
FIG. 16 illustrates a view of a process in which a voltage is applied into an auxiliary line of a display apparatus according to a second embodiment.

FIG. 16 is a view of a process in which a voltage is applied into an auxiliary line of a display apparatus according to a second embodiment.

Hereinafter, a display apparatus 1A according to the second embodiment will be described with reference to FIG. 16. In the display apparatus 1A according to the second embodiment, a display area is divided into a plurality of areas. A voltage may be applied between a first upper electrode 500 and an auxiliary line 210, and a process of forming a contact opening may be performed on each of the areas.

As illustrated in FIG. 16, the display area of the display apparatus 1A may be divided into a first display area 100A1 and a second display area 100A2. The display apparatus 1A may include a first voltage apply unit 70A1 for applying a voltage between a first upper electrode 500 and an auxiliary line 210 on the first display area 100A1 and a second voltage applying unit 70A2 for applying a voltage between the first upper electrode 500 and the auxiliary line 210 on the second display area 100A2. At least one of the first upper electrode 500 and the auxiliary line 210 may be electrically separated between the first display area 100A1 and the second display area 100A2.

According to the above-described structure, the voltage may be independently applied into the first and second display areas 100A1 and 100A2 of the display apparatus 1A.

In the display apparatus 1A according to the second embodiment, the large-scale display area may be divided into the plurality of areas to prevent a large amount of current from flowing through the display area and prevent the upper electrode from being burnt by the large amount of current. In the display apparatus 1A according to the second embodiment, even though short-circuit may occur at a portion of the first display area 100A1, the short-circuit may not have an influence on the second display area 100A2.

<3. Third Embodiment>

Figure 17:
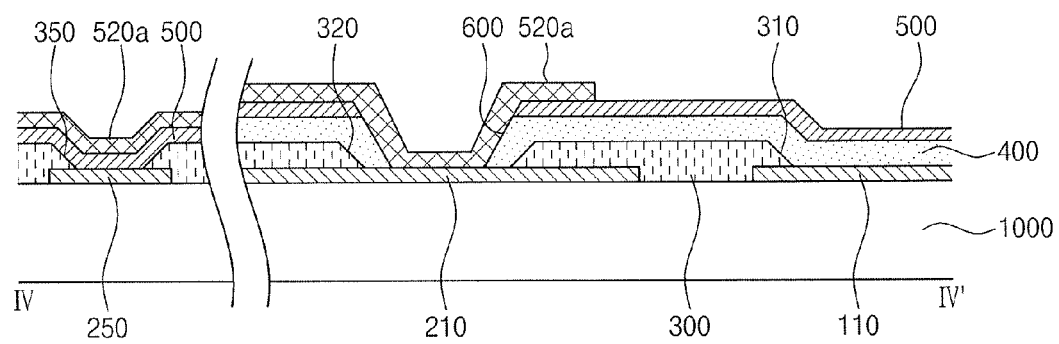
FIG. 17 illustrates a cross-sectional view of a stacked structure of a display apparatus according to a third embodiment.

FIG. 17 illustrates a cross-sectional view of a stacked structure of a display apparatus according to a third embodiment.

Hereinafter, a display apparatus according to the third embodiment will be described with reference to FIG. 17. The display apparatus according to the third embodiment may have a structure in which a second upper electrode 520a does not extend up to an area corresponding to a pixel electrode 110.

As illustrated in FIG. 17, in the display apparatus according to the third embodiment, the second upper electrode 520a may be disposed on an auxiliary line 210 that is disposed to correspond to a contact opening 600 and a power connection electrode 250. The second upper electrode 520a may not be disposed on an organic light emitting layer 400 that is disposed to correspond to a pixel electrode 110. For example, the second upper electrode 520a may be selectively disposed on the first upper electrode 500 that is disposed to correspond to the contact opening 600 and the auxiliary line 210 that is exposed by the contact opening 60 to electrically connect the first upper electrode 500 to the auxiliary line 210. The second upper electrode 520a may be formed of any metal having conductivity.

The first upper electrode 500 may be disposed on the organic light emitting layer 400 that is disposed to correspond to the pixel electrode 110. The organic light emitting layer 400 may be disposed between the first upper electrode 500 and the pixel electrode 110 to form an organic EL device. In the organic EL device, the first upper electrode 500 may function as a negative electrode, and the pixel electrode 110 may function as a positive electrode.

For example, the second upper electrode 520 may be disposed on the organic light emitting layer 400 that is disposed to correspond to the pixel electrode 110, and a negative electrode of the organic EL device may be formed by the first and second upper electrodes 500 and 520. In the organic EL device, it may be necessary to optimize a micro cavity structure as a stacked layer of the first and second upper electrodes 500 and 520. Since it may be necessary to electrically connect the auxiliary line 210 to the first upper electrode 500 through the second upper electrode 520, the available layer thickness and sheet resistance may be limited.

In the display apparatus according to the third embodiment, the negative electrode of the organic EL device may be formed as only the first upper electrode 500, and the micro cavity structure in the organic EL device may be easily controlled. The second upper electrode 520a may be formed as a layer that may have a predetermined thickness and may function as a sheet resistor, when the auxiliary line 210 and the first upper electrode 500 are connected to each other, and the second upper electrode 520a may be formed to have a sufficient layer thickness to reduce contact resistance.

The micro cavity structure of the organic EL device of the display apparatus according to the third embodiment may be more easily controlled. The second upper electrode 520a may have a predetermined layer thickness and sheet resistance, and a degree of free in design of the display apparatus may be improved.

Unlike the third embodiment, in the display apparatus according to an embodiment, a structure in which the first upper electrode 500 is not disposed on the organic light emitting layer 400 that is disposed to correspond to the pixel electrode 110, and the second upper electrode 520 is disposed on the organic light emitting layer 400 that is disposed to correspond to the pixel electrode 110 may be adoptable. The organic light emitting layer 400 may be stacked between the second upper electrode 520 and the pixel electrode 110. The second upper electrode 520 may function as a negative electrode, and the pixel electrode 110 may function as a positive electrode to form the organic EL device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Hereinafter, a display apparatus according to an embodiment will be described in detail with reference to Examples and Comparison Examples.

[4.1. Manufacture of Display Apparatus]

A display apparatus according to an embodiment was manufactured in following order. In the following descriptions, a structure and manufacturing method of the display apparatus are provided merely as an example.

EXAMPLE 1

First, a pixel circuit including 10 pixels×10 pixels, each of which had a pixel pitch of about 318 μm, was formed on a TFT that was formed of low-temperature poly-Si on a glass substrate. A through-hole was formed in a connection portion between the pixel circuit and a pixel electrode, and a polarization layer (having a thickness of about 2 μm) formed of polyimide was formed on a portion except for the through-hole.

Then, a stacked electrode layer of which a lower layer was formed of a silver alloy (AgPdCu) (having a layer thickness of about 150 nm), and an upper layer was formed of ITO (having a layer thickness of about 20 nm) was patterned on the same surface thereof to form a pixel electrode, an auxiliary line, and a power connection electrode. Sequentially, an insulation layer formed of polyimide was patterned so that an opening portion (a first opening) of the pixel and a connection portion (a second opening) between the auxiliary line and the upper electrode are exposed. One connection portion between the auxiliary line and the upper electrode was formed on one pixel. The auxiliary line included a pad unit for applying a voltage outside a display area so that a voltage was applied between a first upper electrode and the auxiliary line in the post processes. The power connection electrode was formed outside the display area of the display apparatus.

Then, oxygen plasma processing was performed on a surface of the insulation layer to form an organic light emitting layer by using a vacuum deposition process. The organic light emitting layer was formed by successively stacking an m-MTDATA layer (formed of 4,4',4"-Tris(3-methyl-phenylphenylamino)tri-phenylamine and having a layer thickness of about 50 nm), an NPB layer (formed of N, N-Di(naphthalene-1-yl)-N, N-diphenyl-benzidene and having a layer thickness of about 70 nm), a light emitting layer (having a layer thickness of about 30 nm), an Alq3 layer (formed of Tris(8-hydroxyquinolinato)aluminium and having a layer thickness of about 30 nm), and an LiF layer (having a layer thickness of about 1 nm) upward from a lower side. The light emitting layer was formed by co-depositing ADN(9,10-Di(2-naphthyl)anthracene and DPAVBi(4,4'-Bis[2-{4-(N, N-diphenylamino)phenyl}vinyl]biphenyl) containing about 5 wt % based on the total weight of the light emitting layer. The organic light emitting layer was formed on only the display area of the display apparatus by using a mask and was not formed on the pad unit for applying the voltage, which was disposed outside the display area.

The first upper electrode was formed of MgAg (Mg:Ag=10:1) to have a layer thickness of about 5 nm by using the vacuum deposition process. The first upper electrode was patterned by using a mask to form a pad unit for applying a voltage.

Then, an AC voltage was applied between the auxiliary line and the first upper electrode by using the pad unit for applying the voltage under the nitrogen atmosphere. A frequency of the applied AC voltage may be about 100 kHz. An effective apply voltage may be about 10 Vrms to about 30 Vrms. It was confirmed that discharge, for example, due to insulation breakdown, occurred between the auxiliary line and the first upper electrode by the applying of the voltage, and portions of the organic light emitting layer and the first upper electrode were removed.

A second upper electrode was formed of MgAg (Mg:Ag=10:1) to have a layer thickness of about 10 nm by using the vacuum deposition process, and the power connection electrode, the auxiliary line, and the first upper electrode were connected to the second upper electrode. Sequentially, the display area of the substrate was covered by a transparent encapsulation glass, and then the substrate and the transparent encapsulation glass were bonded to each other by using an UV curing resin to encapsulate the substrate, thereby manufacturing an organic EL display apparatus.

EXAMPLE 2

An organic EL display apparatus was manufactured by using the same method as Example 1 except that a first upper electrode was formed to have a layer thickness of about 15 nm, and a second upper electrode was formed of IZO through a sputtering process to have a layer thickness of about 20 nm.

EXAMPLE 3

An organic EL display apparatus was manufactured by using the same method as Example 1 except that a first upper electrode was formed to have a layer thickness of about 15 nm, and a second upper electrode was selectively formed on a connection portion (a contact opening) between an auxiliary line and a first upper electrode by using a metal mask to have a layer thickness of about 12 nm. Example 3 may be an embodiment of a display apparatus having the above-described structure in the third embodiment.

COMPARATIVE EXAMPLE 1

An organic EL display apparatus was manufactured by using the same method as Example 1 except that a power connection electrode was directly connected to a first upper electrode without electrically connecting the power connection electrode, an auxiliary line, and the first upper electrode to each other through a second upper electrode.

COMPARATIVE EXAMPLE 2

An organic EL display apparatus was manufactured by using the same method as Example 1 except that a contact opening due to discharge was not formed, and a power connection electrode, an auxiliary line, and a first upper electrode are not electrically connected to each other.

[4.2. Evaluation Results]

Evaluation results of the organic EL display apparatuses manufactured according to Examples 1 to 3 and Comparative Examples 1 and 2 are shown in Table 1 below.

Keithley 2400 source meter was used for measuring electric resistance at the connection portion between the auxiliary line and the first upper electrode in the manufactured organic EL display apparatus. Hamamatsu photonics C9920-11 brightness light Distribution characteristics measurement device was used for the evaluation of light emitting efficiency of the manufactured organic EL display apparatus. In Table 1 below, a value of the electric resistance was provided as a mean value of electric resistance at 100 connection portions between the auxiliary line and the first upper electrode which are provided in each pixel. A driving voltage and light emitting efficiency were measured by using current of about 3 mA.

Since the connection portion between the auxiliary line and the first upper electrode was not provided in Comparative Example 1, the electric resistance was not measured in Comparative Example 1. In Comparative Example 2, a voltage was not applied to the organic EL device, and the organic EL display apparatus was not turned on. In Comparative Example 2, electric resistance between the auxiliary line and the first upper electrode was measured to about 1 GΩ or more.

TABLE 1

|  | Electric resistance [Ω] | Driving voltage [V] | Light emitting efficiency [cd/A] |
| --- | --- | --- | --- |
| Example 1 | 1700 | 7.05 | 4.5 |
| Example 2 | 2300 | 7.07 | 4.5 |
| Example 3 | 1300 | 7.04 | 4.5 |
| Comparative Example 1 | No measurement | 7.0 | 4.5 |

Referring to the results shown in Table 1, the organic EL display apparatus according to Examples 1 to 3 emitted light at the same driving voltage and with light emitting efficiency when compared to Comparative Example 1 in which the power connection electrode and the first upper electrode were directly connected to each other.

In the organic EL display apparatus according to Examples 1 to 3, the connection portion between the auxiliary line and the first upper electrode had electric resistance of about 50 kΩ or less, a voltage drop was restricted, and non-uniformity in brightness on the whole screen was prevented.

By way of summation and review, in a display apparatus, a top emission type display apparatus in which a light emitting device may emit light in a direction opposite to a TFT may prevent an aperture ratio in each pixel from being deteriorated by the TFT circuit.

In an organic EL display apparatus having a top emission type structure, it may be necessary to form an electrode (hereinbefore, referred to as an upper electrode) disposed in a light emitting direction (i.e., a side opposite to the TFT) of the light emitting device by using a thin film metal or transparent conductive oxide so that the electrode has light transmission.

It may be difficult to further reduce low resistance of the electrode formed by using the thin film metal or transparent conductive oxide, voltage drop may occur over the electrode, and brightness on a screen of the display apparatus may be non-uniform. Non-uniformity in brightness may significantly increase as a current amount and screen size increase.

Voltage drop may be reduced by connecting an upper electrode to a power supply source through an auxiliary line having low resistance. An organic layer of a connection part may be removed by using laser ablation when a connection portion between an auxiliary line and an upper electrode are covered by the organic layer. An auxiliary line may be connected to an upper electrode by using a wrap-around property when an organic layer and the upper electrode are formed.

When a separate line or auxiliary line is formed, the number of manufacturing processes and manufacturing costs may increase, and yield in production may deteriorate. When the auxiliary line and the upper electrode are connected to each other, a manufacturing process may become complicated, and manufacturing costs may increase, or yield in production may decrease.

As described above, in the display apparatus according to an embodiment, the connection between the auxiliary line and the upper electrode may be simplified, and the auxiliary line and the upper electrode may be connected to each other without performing a precise alignment with the mask or the selective laser irradiation. In the display apparatus according to an embodiment, the possibility of an occurrence of defects within the screen may be reduced. The voltage drop in the upper electrode may be restricted, and non-uniformity in brightness within the screen may be prevented.

As described above, according to embodiments, the display apparatus may include an auxiliary line and an upper electrode which are simply connected to each other and a method for manufacturing the same may be provided.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
a substrate;
a pixel electrode on the substrate and corresponding to a pixel;
an auxiliary line on the substrate and insulated from the pixel electrode;
an insulation layer on the pixel electrode and the auxiliary line, the insulation layer covering at least a portion of the pixel electrode and at least a portion of the auxiliary line;
an organic light emitting layer on the pixel electrode, the auxiliary line, and the insulation layer;
a first electrode on the organic light emitting layer and overlapping at least a portion of the auxiliary line;
an opening in each of the organic light emitting layer and the first electrode to correspond to the auxiliary line; and
a second electrode on the first electrode and an exposed portion of the auxiliary line, the second electrode electrically connecting the auxiliary line to the first electrode, the exposed portion of the auxiliary line being exposed by the opening, wherein:
the first electrode defines a hole corresponding to the auxiliary line,
the exposed portion of the auxiliary line includes at least one stepped portion,
the stepped portion has an edge adjacent to the organic light emitting layer, and
the edge of the stepped portion has a reversely tapered shape that protrudes.

2. The display apparatus as claimed in claim 1, wherein the stepped portion has a height greater than about ¼ of a thickness of the organic light emitting layer.

3. The display apparatus as claimed in claim 1, wherein:
the second electrode includes a plurality of second electrodes, each second electrode being on each of at least one or more pixels, and a mean value of electric resistance of the auxiliary line and the first electrode which are electrically connected to each other by the second electrodes is below about 200 kΩ.

4. The display apparatus as claimed in claim 1, wherein: the first electrode has one side that overlaps the auxiliary line and another side that extends from the one side to overlap the pixel electrode, and
the second electrode does not overlap the pixel electrode.

5. The display apparatus as claimed in claim 1, further comprising a power supply line electrically connected to the auxiliary line through at least one of the first and second electrodes to supply power allowing the organic light emitting layer to emit light.

6. The display apparatus as claimed in claim 1, wherein the pixel electrode and the auxiliary line are on a same layer.

7. A method for manufacturing a display apparatus, the method comprising:
providing a substrate;
forming a pixel electrode corresponding to as pixel on the substrate;
forming an auxiliary line on the substrate, the auxiliary line being insulated from the pixel electrode;
forming an insulation layer on the pixel electrode and the auxiliary line to cover at least a portion of the pixel electrode and at least a portion of the auxiliary line;
forming an organic light emitting layer on the pixel electrode, the auxiliary line, and the insulation layer;
forming a first electrode on the organic light emitting layer to overlap at least a portion of the auxiliary line;
applying a voltage between the auxiliary line and the first electrode to generate discharge;
removing portions of the organic light emitting layer and the first electrode using the discharge;
removing portions of the organic light emitting layer and the first electrode to form an opening that exposes an exposed portion of the auxiliary line; and
forming a second electrode that electrically connects the first electrode and the exposed portion, wherein:
the first electrode defines a hole corresponding to the auxiliary line,
the exposed portion of the auxiliary line includes at least one stepped portion,
the stepped portion has an edge adjacent to the organic light emitting layer, and
the edge of the stepped portion has a reversely tapered shape that protrudes.

8. The method as claimed in claim 7, wherein the voltage is an alternating current (AC) voltage.

9. The method as claimed in claim 8, wherein the voltage is greater than that of a voltage at which insulation breakdown occurs in the organic light emitting layer.

10. The method as claimed in claim 9, wherein the voltage has an effective apply voltage of about 10 Vrms to about 30 Vrms.

11. The method as claimed in claim 7, including forming a plurality of auxiliary lines insulated from each other, wherein forming the opening is performed on each of the auxiliary lines.

* * * * *